United States Patent
Melava

(10) Patent No.: US 7,035,367 B2
(45) Date of Patent: Apr. 25, 2006

(54) FRACTIONAL MULTI-MODULUS PRESCALER

(75) Inventor: Jari Melava, Salo (FI)

(73) Assignee: Nokia Corporation, Espoo (FI)

( * ) Notice: Subject to any disclaimer, the term of this patent is extended or adjusted under 35 U.S.C. 154(b) by 872 days.

(21) Appl. No.: 09/965,657

(22) Filed: Sep. 26, 2001

(65) Prior Publication Data

US 2003/0058979 A1    Mar. 27, 2003

(51) Int. Cl.
H04L 7/02 (2006.01)
H04L 7/04 (2006.01)

(52) U.S. Cl. ............ 375/376; 375/327; 375/373; 375/375; 331/16; 455/260

(58) Field of Classification Search .......... 375/376, 375/327, 373, 375; 327/115, 117, 105, 147, 327/156; 331/57–61, 16; 377/43, 48; 455/260
See application file for complete search history.

(56) References Cited

U.S. PATENT DOCUMENTS

| | | | |
|---|---|---|---|
| 5,189,685 A | 2/1993 | Jaffard et al. | |
| 5,970,110 A | 10/1999 | Li | |
| 6,157,694 A | 12/2000 | Larsson | |
| 6,281,759 B1 | 8/2001 | Coffey | |
| 6,441,655 B1 * | 8/2002 | Fallahi et al. | 327/115 |
| 6,574,288 B1 * | 6/2003 | Welland et al. | 375/327 |
| 6,583,674 B1 * | 6/2003 | Melava et al. | 331/16 |

FOREIGN PATENT DOCUMENTS

WO    WO 01/45263 A1    6/2001

OTHER PUBLICATIONS

Craninckx J et al: "A 1.75-GHZ/3-V Dual-Modulus Divide-by-128/129 Prescaler in 0.7-MUM CMOS", IEEE Journal of Solid-State Circuits, IEEE Inc. New York, US, vol. 31, No. 7, Jul. 1, 1996, pp. 890-897, XP000632373.

* cited by examiner

*Primary Examiner*—Khai Tran
*Assistant Examiner*—Edith Chang
(74) *Attorney, Agent, or Firm*—Ware, Fressola, Van Der Sluys & Adolphson LLP

(57) ABSTRACT

A fractional multi-modulus prescaler is disclosed wherein the output of the VCO is separated into four signals 90 degrees phase-related to one another. The phase signals are selected by a multiplexer for application of a division function during the modulus time period. The multiplexer is returned to the original selected phase prior to responding to a subsequent phase select control signal, whereby the generation of multi-modulus spurious frequency signals is prevented.

13 Claims, 2 Drawing Sheets

12# FRACTIONAL MULTI-MODULUS PRESCALER

TECHNICAL FIELD

The present invention relates generally to frequency synthesis and multi-modulus prescalers and deals more particularly with a phase-switching fractional multi-modulus prescaler.

BACKGROUND OF THE INVENTION

Prescalers are used in the feedback loop between the output of a voltage-controlled oscillator (VCO) and the phase frequency detector in phase locked loop frequency synthesizers to generate higher frequencies. A multi-modulus prescaler is one in which the division ratio can be switched among the multiple division ratios by an external control signal to extend the upper frequency range of the synthesizer but still allow the synthesis of lower frequencies. For example, a four-modulus prescaler offers four different scaling factors and two control signals are required to select one of the four different scaling factors.

A disadvantage of multi-modulus prescalers is that unwanted spurious frequencies are generated by the operation of the multi-modulus. These unwanted spurious frequencies are generally located around the desired frequency, which adds noise to the loop. The generation of spurious frequencies is undesirable; particularly when the phase locked loop frequency synthesizer is used as a local oscillator in a communication system, particularly multi-user, radio communication systems such as, for example, cellular communication systems.

Another disadvantage of multi-modulus prescalers is the limitation on speed at the system level that results from a divider with a changing division ratio, which is slower when compared to the speed of a system with a fixed division ratio. The difference in speed is due to the additional logic inserted in the loop to select the divider ratio which introduces longer delays into the loop. It is known to select the division ratio outside the loop by using the phase in quadrature from the divider to accelerate the system. A multiplexer (MUX) located after the divider places the proper phase at the output. Although selection of the division ratio in this manner may speed up the system operation, the problem of spurious frequency generation is still present because the MUX does not always return to its original phase.

It would be desirable therefore to provide a fractional multi-modulus prescaler that overcomes the problems generally associated with known prescalers.

It is an object of the present invention therefore to provide a fractional multi-modulus prescaler without modulus caused spurious frequencies.

SUMMARY OF THE INVENTION

The present invention provides a fractional multi-modulus prescaler without modulus caused spurious frequencies. In one aspect of the invention, the fractional multi-modulus prescaler operates directly on the input frequency signal which is input to a polyphase filter. The polyphase filter produces one or more output phase signals having a phase difference of 90 degrees relative to one another. A multiplexer is coupled to the output of the polyphase filter and selects the one or more output phase signals in response to a multiplexer control signal. An asynchronous divide-by-N divider has its input coupled to the output of the multiplexer. The asynchronous divide-by-N divider generates an output frequency signal in accordance with the one or more selected output phase signals. A phase control generates the multiplexer control signal in response to the presence of an input D-CTRL signal, a MOD signal and a feedback signal generated by the divide-by-N divider, whereby the output frequency signal is a desired fractional multiple of the input frequency signal.

BRIEF DESCRIPTION OF THE DRAWINGS

Other features, benefits and advantages of the present invention become readily evident from the following written description taken in conjunction with the drawings wherein.

DETAILED DESCRIPTION OF PREFERRED EMBODIMENTS

Figure 1:
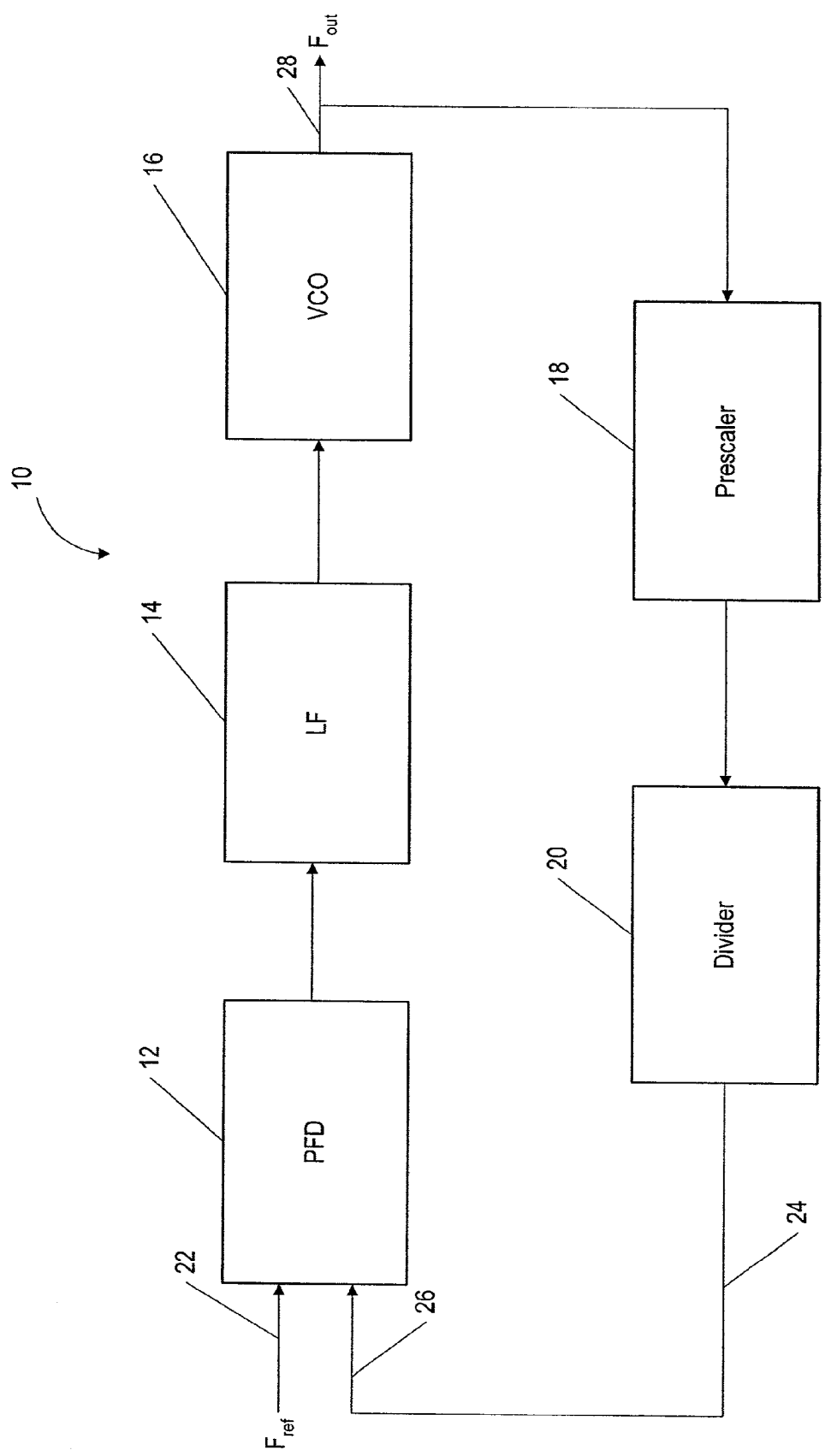
FIG. 1 is a block diagram of a representative phase locked loop frequency synthesizer showing a prescaler in the feedback loop.

A functional block diagram of a representative phase locked loop frequency synthesizer having a prescaler in the feedback loop is illustrated in FIG. 1 and generally designated 10. The phase locked loop frequency synthesizer 10 is a general class known as fractional-N phase locked loop frequency synthesizers and includes a phase frequency detector 12, a loop filter 14 and a voltage-controlled oscillator (VCO) 16. A prescaler 18 and a divider 20 are located in the feedback loop between the VCO output and an input to the phase frequency detector. A reference frequency $F_{ref}$ is applied to the input 22 of the phase frequency detector 12 along with the output 24 of the divider 20, which is fed to the input 26 of the phase frequency detector 12. The output 28 of the VCO 16 is a frequency $F_{out}$ that is related to the input frequency $F_{ref}$ by a scaling factor as determined by the combination of the prescaler 18 and the divider 20. The prescaler 18 may be a multi-modulus prescaler which offers different scaling factors, for example, a dual-modulus prescaler offers two different scaling factors and a four-modulus prescaler offers four different scaling factors. The principles of operation of a phase locked loop frequency synthesizer as illustrated in FIG. 1 are generally well understood by those skilled in the art of frequency synthesis employing phase locked loops with a division function in the feedback loop. It will also be appreciated that the frequency $F_{out}$ at the VCO output 28 is an integer multiple of the input frequency $F_{ref}$ or may be a fractional multiple of the input frequency $F_{ref}$ by controlling the prescaler 18 and divider 20.

Figure 2:
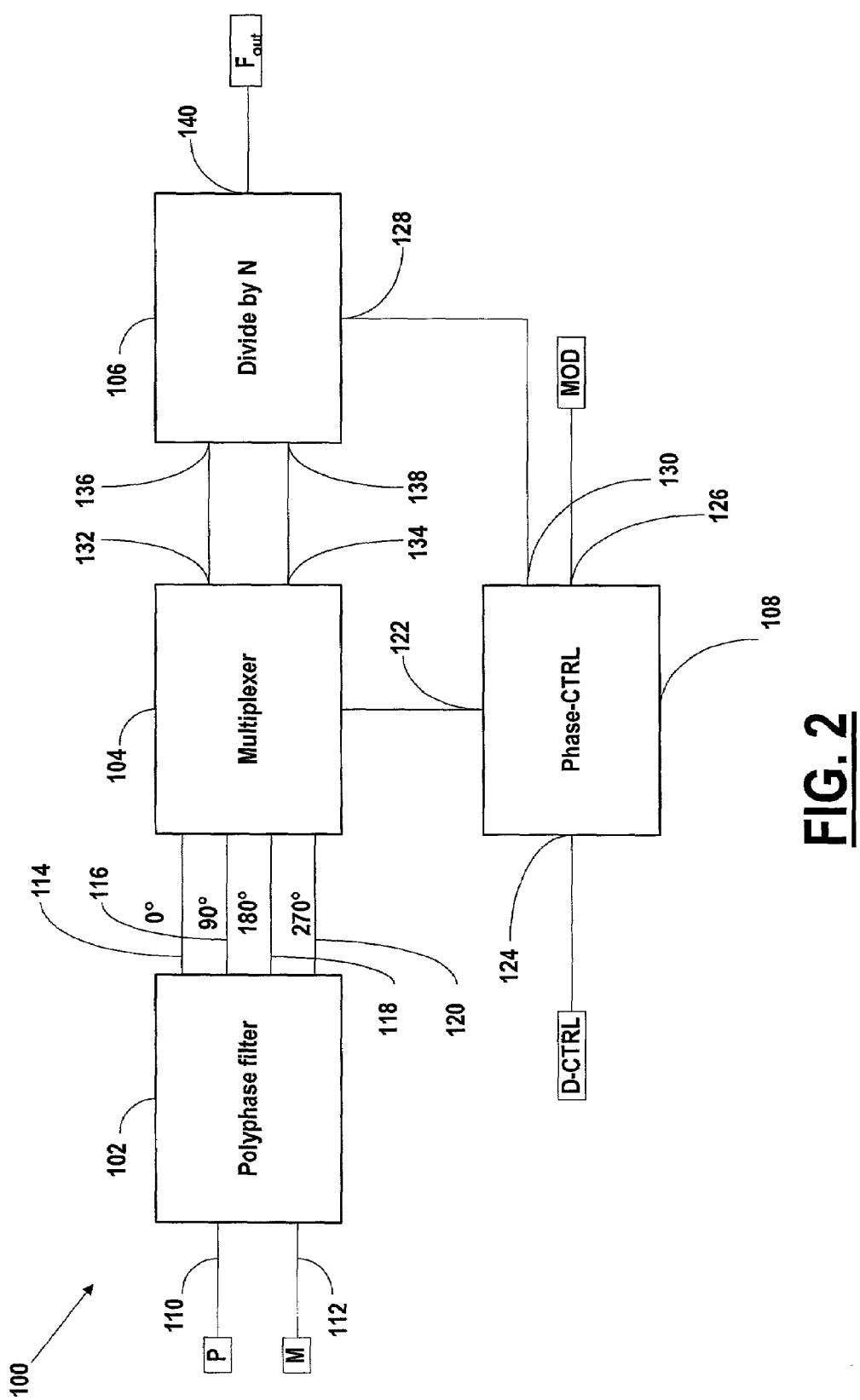
FIG. 2 is a schematic functional block diagram of a fractional multi-modulus prescaler embodying the present invention.

Turning now to FIG. 2, a schematic functional block diagram of a fractional multi-modulus prescaler embodying the present invention is illustrated therein and generally designated 100. The prescaler 100 comprises a polyphase filter 102, a multiplexer (MUX) 104, a divide-by-N divider 106 and a phase control 108. The divide-by-N divider 106 is comprised of a number of dividers in accordance with the number of the modulus and corresponding to the output frequency multiple to be generated. The input signal to the multi-modulus 100 is a differential signal PM generated by a VCO; i.e., the VCO output frequency of the VCO in the frequency synthesizer with which the prescaler 100 is used. The input signal PM is a differential signal and is applied across the input 110, 112 of the polyphase filter 102 and functions as the clock signal to the polyphase filter. The polyphase filter 102 operates to separate the input signal into a quadrature signal or four separate signals having a 90-degree phase difference relative to one another and are output on the leads 114, 116, 118, 120. The output leads 114, 116, 118, 120 correspond to 0-degree phase, 90-degree phase, 180-degree phase and 270-degree phase, respectively. The outputs 114, 116, 118, 120 of the polyphase filter 102 are input to the multiplexer 104. The phase control 108 has an output 122 coupled to the multiplexer 104 to control the multiplexer, as described below. The phase control 108 operates in response to the input control signal D-CTRL on input 124, the MOD signal on input 126 and the feedback signal from the output 128 of some divider in the divider chain of the divide-by-N divider 106. The feedback signal from the output 128 is applied to the input 130 of the phase control 108 and is selected from the appropriate divider to produce the desired division ratio of the prescaler 100. The D-CTRL signal is a digital word and, for example, may be three bits long, thus providing a digital word having eight possible combinations. The D-CTRL signal word is generated external to the multi-modulus by the system and contains information relating to the phase of the signal to be selected from the polyphase filter. The phase control 108 is disabled when the MOD signal at input 126 is a logical "low," resulting in only one of the four input signals to the MUX from the output 114, 116, 118, 120, respectively, of the polyphase filter being selected and connected to the output on leads 132, 134 of the multiplexer 104. The output of the multiplexer on leads 132, 134 is connected to the input 136, 138 of the divide-by-N divider 106. The output signal across the multiplexer output leads 132, 134 functions as the clock signal to the input 136, 138 of the divide-by-N divider 106. The divide-by-N divider 106 is an asynchronous divide-by-N divider, where N is an integer power of 2, and therefore the output frequency $F_{out}$ at the output 140 of the divider 106 is N times smaller than the input reference frequency. The prescaler 100 performs basic division when the multiplexer 104 is not enabled.

The phase control 108 is enabled when the MOD signal at the input 126 is a logical "high." Depending upon the control word D-CTRL at the input 124, the phase control 108 causes the multiplexer 104 to select different phases from the polyphase filter 102 outputs on the leads 114, 116, 118, 120, respectively, to connect the selected phase to the divide-by-N divider 106. Thus, the prescaler can be a signal/dual/multi-modulus prescaler in accordance with the control word D-CTRL.

The prescaler 100 of the present invention is able to perform other than basic division in the following manner. The multiplexer 104 is enabled and the output signal 122 of the phase control 108 is changed so that the multiplexer 104 connects the selected signal delayed 90 degrees with respect to the signal present at the input to the output 132, 134 of the multiplexer 104. If the signal present has a period $T_0$ and the delay is equal to 90 degrees with respect to the signal, the delay is $0.25 \times T_0$. From this it follows that in general the division ratio is N+C/4, where C is the number of changes in the multiplexed signal per the output frequency $F_{out}$ period. When the output signal 122 of the phase controller 108 is switched, for example, four times in the period of the output frequency $F_{out}$, the division ratio of the prescaler is N+1.

Since the input signal is operated on directly by the polyphase filter to create the 90-degree phase difference relative to the input signal, it is possible to multiplex the input signal frequency. Although the modulus in the frequency synthesizer may be set to any number, the multiplexer passes through all phases (M×4×90 degrees=M×360 degrees) where M is the number of modulus pulses and returns to its original phase. Applicant has found that if the output signal of the multiplexer does not return to its original phase within the modulus, spurious frequencies result which depend on the time period starting from original-phase back to original-phase. Thus, the operation of the fractional multi-modulus prescaler of the present invention eliminates spurious frequencies as a result of the multiplexer always returning to its original phase regardless of the number of the modulus.

It will be understood that the fractional multi-modulus prescaler of the present invention is not to be considered as limited to the specific embodiments described above and shown in the drawings, which are merely illustrative as the best mode presently contemplated for carrying out the invention and may be implemented utilizing a number of different techniques to carry out the functions described, as may be obvious to those skilled in the frequency synthesis art, but rather that the invention is intended to cover all such variations, modifications and equivalents thereof as may be deemed to be within the scope of the claims appended hereto. Therefore the invention has been described by way of illustration rather than limitation.

What is claimed is:

1. A fractional multi-modulus prescaler comprising:
a polyphase filter having an input for receiving an input frequency signal and for producing one or more output phase signals each of said one or more output phase signals having the same frequency as the polyphase filter input frequency signal and a phase difference of 90 degrees relative to one another;
a multiplexer coupled to said polyphase filter for selecting said one or more output phase signals in response to a multiplexer control signal;
an asynchronous divide-by-N divider coupled to said multiplexer and having an input for receiving said one or more multiplexer selected output phase signals and for generating an output frequency signal;
a phase control for generating said multiplexer control signal in response to the presence of an input D-CTRL word signal, a MOD signal and a feedback signal generated by said divide-by-N divider, whereby the frequency of said divide-by-N divider output frequency signal is a desired fractional multiple of the frequency of said input frequency signal.

2. The fractional multi-modulus prescaler as defined in claim 1, wherein said phase control is disabled in response to a "low" MOD signal, whereby the division ratio is N.

3. The fractional multi-modulus prescaler as defined in claim 1, wherein said phase control is enabled in response to a "high" MOD signal to generate said multiplexer control signal.

4. The fractional multi-modulus prescaler as defined in claim 3, wherein said phase control generates said multiplexer control signal in accordance with the value of said D-CTRL word signal and said divide-by-N divider feedback signal, whereby said multiplexer selects from said one or more output phase signals an output phase signal corresponding to said D-CTRL word signal.

5. The fractional multi-modulus prescaler as defined in claim 4, wherein the division ratio of the fractional multi-modulus prescaler is N+C/4, where the value of C corresponds to the number of changes of the multiplexer control signal in one period of the output frequency signal.

6. The fractional multi-modulus prescaler as defined in claim 5, wherein the division ratio is N+1 when the multiplexer control signal changes four times in one period of the output frequency signal.

7. The fractional multi-modulus prescaler as defined in claim 1, wherein the input frequency signal is a differential signal.

8. The fractional multi-modulus prescaler as defined in claim 5, wherein said multiplexer selects from said one or more output phase signals a desired one of said output phase signals more frequently to increase the division ratio and less frequently to lower the division ratio.

9. A fractional multi-modulus prescaler for use in a phase locked loop fractional-N frequency synthesizer comprising:
  means for providing a quadrature signal from the frequency synthesizer output frequency signal having the same frequency as the frequency synthesizer output frequency signal;
  means for selecting at least one phase signal of said quadrature signal in accordance with a phase select control signal corresponding to the number of the modulus;
  means for applying a division function to the selected phase signal of said quadrature signal for each of the phase signals selected during a modulus time period, said modulus time period being defined as starting from an original selected phase signal and returning to the original selected phase signal; and
  means for returning said phase selecting means to the original selected phase prior to said phase selecting means responding to a subsequent phase select control signal, whereby the generation of multi-modulus spurious frequency signals is prevented.

10. The fractional multi-modulus prescaler as defined in claim 9, wherein a selected phase signal of said quadrature signal is selected more frequently to increase the ratio of the division function and less frequently to decrease the ratio of the division function.

11. The fractional multi-modulus prescaler as defined in claim 9, wherein said phase selecting means selects two phases of the quadrature signal, whereby the multi-modulus prescaler is a dual-modulus prescaler.

12. The fractional multi-modulus prescaler as defined in claim 9, wherein said phase selecting means selects four phases of the quadrature signal, whereby the multi-modulus prescaler is a four-modulus prescaler.

13. A method for providing a spurious frequency-free multi-modulus prescaler comprising the steps of:
  providing a quadrature signal corresponding to the output frequency signal of a voltage-controlled oscillator in a phase locked loop fractional-N frequency synthesizer having the same frequency as the output frequency signal of the voltage-controlled oscillator;
  selecting one or more phases of the quadrature signal in accordance with a phase select control signal corresponding to the number of the modulus;
  applying a division function to the selected phase of the quadrature signal for each of the phases selected during a modulus time period to generate the desired fractional multiple of the input reference frequency; and
  returning to an original selected phase of the quadrature signal prior to responding to a subsequent phase select control signal whereby the generation of multi-modulus spurious frequency signals is prevented.

* * * * *